United States Patent
Wang et al.

(10) Patent No.: US 10,768,249 B2
(45) Date of Patent: Sep. 8, 2020

(54) PULSED POWER SYSTEM AND CONTROL METHOD THEREOF

(71) Applicant: GE Precision Healthcare LLC, Wauwatosa, WI (US)

(72) Inventors: Ruxi Wang, Niskayuna, NY (US); Juan Antonio Sabate, Niskayuna, NY (US); Fei Xu, Shanghai (CN); Xiaohu Liu, Niskayuna, NY (US)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 31 days.

(21) Appl. No.: 16/029,324

(22) Filed: Jul. 6, 2018

(65) Prior Publication Data
US 2019/0011512 A1    Jan. 10, 2019

(30) Foreign Application Priority Data

Jul. 7, 2017 (CN) .......................... 2017 1 0550560

(51) Int. Cl.
| | |
|---|---|
| *G01R 33/385* | (2006.01) |
| *H03K 3/012* | (2006.01) |
| *H03K 17/687* | (2006.01) |
| *H02M 3/07* | (2006.01) |
| *H02M 7/5387* | (2007.01) |
| *H03K 17/10* | (2006.01) |
| *H02M 1/00* | (2006.01) |

(52) U.S. Cl.
CPC .......... *G01R 33/3852* (2013.01); *H02M 3/07* (2013.01); *H02M 7/5387* (2013.01); *H03K 3/012* (2013.01); *H03K 17/102* (2013.01); *H03K 17/687* (2013.01); *H02M 2001/0054* (2013.01); *H02M 2001/0077* (2013.01); *H03K 2217/0036* (2013.01)

(58) Field of Classification Search
CPC .... H03K 17/687; G01R 33/385; G01R 33/36; G01R 33/3852
See application file for complete search history.

(56) References Cited

U.S. PATENT DOCUMENTS

| | | | | |
|---|---|---|---|---|
| 6,112,118 A | * | 8/2000 | Kroll .................... | A61N 1/3931 607/5 |
| 7,423,894 B2 | * | 9/2008 | Ilic ...................... | H02M 3/1584 363/132 |
| 7,714,583 B2 | * | 5/2010 | Zhu ...................... | H02M 7/217 324/318 |

(Continued)

FOREIGN PATENT DOCUMENTS

| | | |
|---|---|---|
| CN | 105471393 A | 4/2016 |
| CN | 105591537 A | 5/2016 |

*Primary Examiner* — Dominic E Hawkins
(74) *Attorney, Agent, or Firm* — Armstrong Teasdale LLP (57) ABSTRACT

A pulsed power system is disclosed, which comprises at least two H-bridges cascaded for providing pulsed current to a load. Each H-bridge comprises at least two legs, and each leg comprises at least two transistor switches connected in series. Each transistor switch comprises a transistor and a diode electrically coupled with the transistor in parallel. The pulsed power system also comprises a controller configured to determine if a slew rate of the load current is lower than a threshold, and to reduce switching loss in response to the slew rate being lower than the threshold.

14 Claims, 8 Drawing Sheets

(56) References Cited

U.S. PATENT DOCUMENTS

| | | | |
|---|---|---|---|
| 8,502,539 B2 * | 8/2013 | Lai | G01R 33/3852 |
| | | | 324/309 |
| 2015/0316629 A1 * | 11/2015 | Kawajiri | G01R 33/34092 |
| | | | 324/322 |

* cited by examiner

PULSED POWER SYSTEM AND CONTROL METHOD THEREOF

CROSS REFERENCE

The present application claims benefit and priority to a Chinese Application No. 201710550560.8, filed Jul. 7, 2017, which is incorporated herein by reference in its entirety.

BACKGROUND

This disclosure relates generally to a power supply technology, and more particularly to a pulsed power system and control method thereof.

Pulsed power is unique technology that can compress energy into a short but intense burst to create extreme conditions without the demand for a very large energetic power source. The pulsed power has been widely utilized in many industrial areas, such as magnetic resonance imaging (MRI).

In general, MRI examinations are based on the interactions among a primary magnetic field, a radiofrequency (RF) magnetic field and time varying magnetic gradient fields with gyromagnetic material having nuclear spins within a subject of interest, such as a patient. The magnetic fields used to generate images in MRI systems include a highly uniform, static magnetic field that is produced by a primary field magnet. A series of gradient fields are produced by a set of gradient coils located around the subject. The gradient fields encode positions of individual plane or volume elements (pixels or voxels) in two or three dimensions. An RF coil is employed to produce an RF magnetic field. This RF magnetic field perturbs the spins of some of the gyromagnetic nuclei from their equilibrium directions, causing the spins to precess around the axis of their equilibrium magnetization. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

In a MRI system, the gradient drivers are configured to excite gradient coils located around an object, for example a patient, to generate magnetic field gradients along X-axes direction, Y-axes direction and Z-axes direction. The time-varying magnetic gradient fields are driven by pulsed sequences of current having a large dynamic range. A gradient driver generally includes an array of semiconductors connected in series and/or parallel which may be stacked to drive a higher amplitude pulse sequence. However, typical configurations of gradient drivers do not have both high switching frequency and low switching loss.

BRIEF DESCRIPTION

In one embodiment, the present disclosure provides a pulsed power system. The pulsed power system comprises at least two H-bridges cascaded for providing pulsed current to a load. Each H-bridge comprises at least two legs, and each leg comprises at least two transistor switches connected in series. Each transistor switch comprises a transistor and a diode electrically coupled with the transistor in parallel. The pulsed power system also comprises a controller configured to determine if a slew rate of the load current is lower than a threshold, and to reduce switching loss in response to the slew rate being lower than the threshold.

In another embodiment, the present disclosure provides a controlling method of a pulsed power system comprising at least two H-bridges cascaded for providing pulsed current to a load. The method comprises receiving a load current signal and a reference current signal, generating a voltage command signal based on the load current signal and reference current signal, determining a slew rate and a current amplitude of the load current associated with the reference current signal, and reducing switching loss in response to the slew rate being lower than a threshold.

In another embodiment, the present disclosure provides a MRI system comprising a primary field magnet; a plurality of gradient coil; a RF transmit coil; a pulsed power system; and a controller. The pulsed power system comprises at least two H-bridges cascaded for providing pulsed current to a gradient coil. Each H-bridge comprises at least two legs, and each leg comprises at least two transistor switches connected in series. Each transistor switch comprises a transistor and a diode electrically coupled with the transistor in parallel. The controller is configured to determine if a slew rate of the load current in the gradient coil is lower than a threshold, and to reduce switching loss in response to the slew rate being lower than the threshold.

DESCRIPTION OF DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Embodiments of the present disclosure will be described herein below with reference to the accompanying drawings. In the following description, well-known functions or constructions are not described in detail to avoid obscuring the disclosure in unnecessary detail.

Unless defined otherwise, technical and scientific terms used herein have the same meaning as is commonly understood by one of ordinary skill in the art to which this disclosure belongs. The terms "first," "second," and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either or all of the listed items. The use of "including," "comprising," or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect.

Embodiments of the present disclosure may be described herein in terms of functional components and various processing steps. It should be appreciated that such functional components may be realized by any number of hardware, software, and/or firmware components configured to perform the specific functions. For example, an embodiment of the present disclosure may employ various integrated circuit components, e.g., memory elements, digital signal processing elements, logic elements, look-up tables, and the like, which may carry out a variety of functions under the control of one or more microprocessors or other control devices. In addition, embodiments of the present disclosure may be practiced in conjunction with any number of data transmission protocols.

Figure 1:
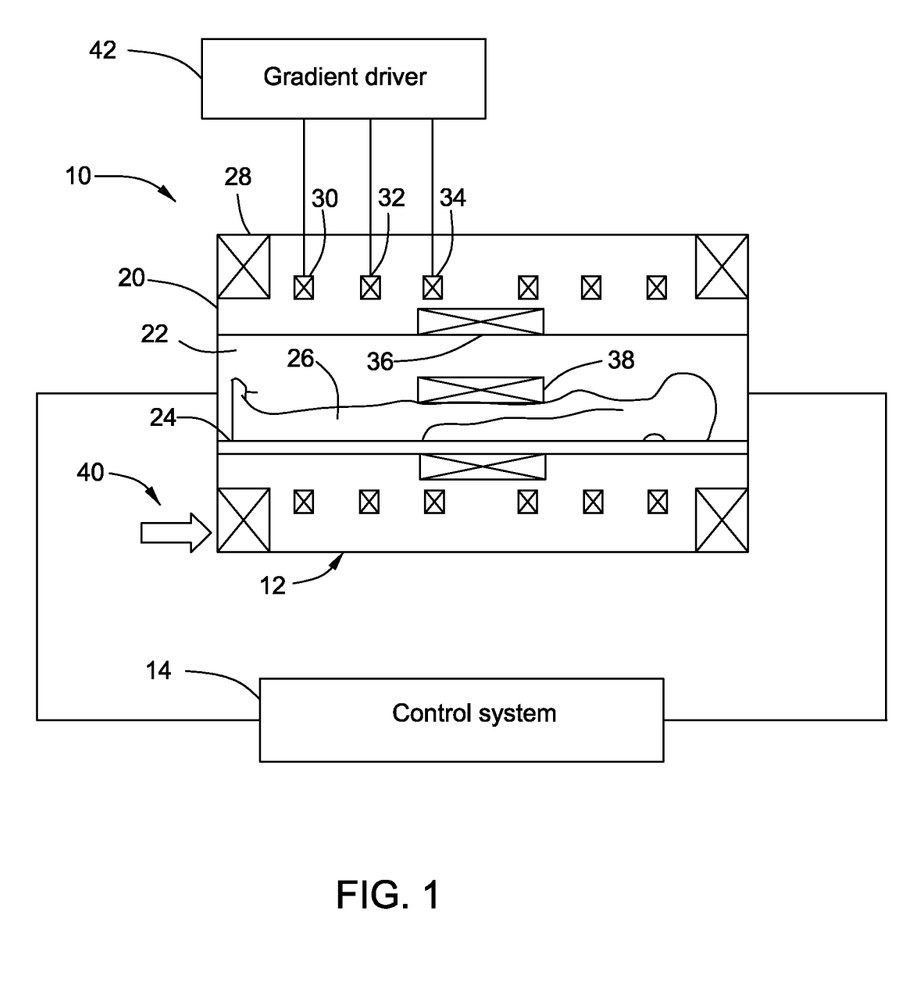
FIG. 1 is a schematic view of a MRI system, in accordance with an embodiment of the present disclosure.

Referring to FIG. 1 of the drawings, a magnetic resonance imaging system 10 is illustrated schematically as including a scanner 12, and a control system 14, which are used in combination to acquire magnetic resonance data and produce an image of a subject of interest. Although the MRI system 10 may include any suitable scanner or detector, in the illustrated embodiment, the system 10 includes a full body scanner 12 having a housing 20 through which a bore 22 is formed. A table 24 can be moved into the bore 22 to permit a patient 26 to be positioned therein for imaging selected anatomy within the patient.

The scanner 12 includes a series of associated coils for producing controlled magnetic fields for exciting the gyromagnetic material within the anatomy of the subject being imaged. Specifically, a primary magnet coil 28 is provided for generating a primary magnetic field generally aligned with the bore 22. In the illustrated embodiment, a main power supply 40 provides power to the primary field coil 28. A series of gradient coils 30, 32, and 34, all or some of which may be controlled by the gradient driver described herein, permit controlled magnetic gradient fields to be generated for positional encoding of certain of the gyromagnetic nuclei within the patient 26 during examination sequences.

A radio frequency (RF) coil 36 is provided, and is configured to generate radio frequency pulses for exciting the certain gyromagnetic nuclei within the patient. In addition to the coils that may be local to the scanner 12, the system 10 also includes a set of receiving coils 38 (e.g., an array of coils) that can be placed proximal (e.g., against) the patient 26. The receiving coils 38 may have any geometry, including both enclosed and single-sided geometries. As an example, the receiving coils 38 can include cervical/thoracic/lumbar (CTL) coils, head coils, single-sided spine coils, and so forth. Generally, the receiving coils 38 are placed close to or on top of the patient 26 so as to receive the weak RF signals (weak relative to the transmitted pulses generated by the scanner coils) that are generated by certain of the gyromagnetic nuclei within the patient 26 as they return to their relaxed state. The receiving coils 38 may be switched off so as not to receive or resonate with the transmit pulses generated by the scanner coils, and may be switched on so as to receive or resonate with the RF signals generated by the relaxing gyromagnetic nuclei.

The scanner 12 comprises a gradient driver 42 configured to excite gradient coils. The control system 14 coordinates the scanner 12 to operate functionally, store the acquired image data for reconstruction, and create an image of the material being scanned. It should be noted that the MRI system described is intended to be exemplary only, and other system types, such as so-called "open" MRI systems may also be used. Similarly, such systems may be rated by the strength of their primary magnet, and any suitable system capable of carrying out the data acquisition and processing described below may be employed.

In a Magnetic Resonance Imaging (MRI) system, the gradient drivers are configured to excite gradient coils located around an object, for example a patient, to generate magnetic field gradients along X-axes direction, Y-axes direction and Z-axes direction. In order to generate enough gradient magnetic fields within short period of time, the gradient driver needs to be designed to drive high current (more than 1000 A) and high voltage (more than 2000V). Meanwhile, high switching frequency is also desired to reduce the output filter size and improve the control bandwidth. The new wide band gap SiC devices (e.g., MOSFETs) offer multiple advantages over the state-of-the-art Si-based IGBTs. SiC MOSFETs achieve much lower on-resistance and faster switching speed when compared with Si counterparts. However, although the switching loss of SiC devices (under relatively high current) is much lower than the Si devices, the SiC depletion capacitance is much higher than the Si devices, which would make the silicon carbide gradient driver less efficient in regulating zero current.

Figure 2:
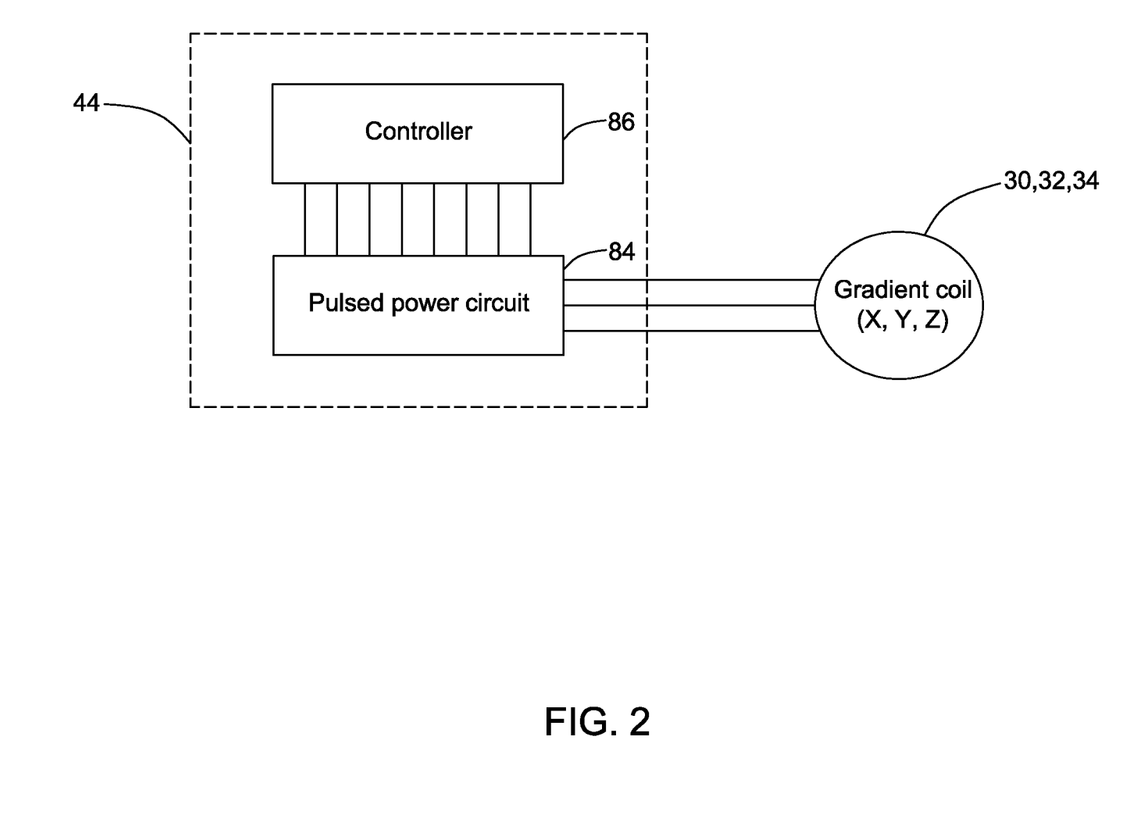
FIG. 2 is a schematic view of a pulsed power system, in accordance with an embodiment of the present disclosure.

A gradient driver 42 which, in accordance with present embodiments includes a pulsed power system 44, is provided for pulsing the gradient coils 30, 32, and 34. Aspects of the pulsed power system are discussed in further detail below with respect to FIGS. 2-6. The pulsed power system may also be used in other industries for other applications that requires pulsed power supply. One embodiment of a pulsed power system 44 for driving the gradient coils 30, 32, 34 of the MR scanner 12 of FIG. 1 is depicted diagrammatically in FIG. 2. As shown in FIG. 2, a pulsed power system 44 for gradient coils in a magnetic resonance imaging (MRI) comprising a pulsed power circuit 84 and a controller 86.

Figure 3:
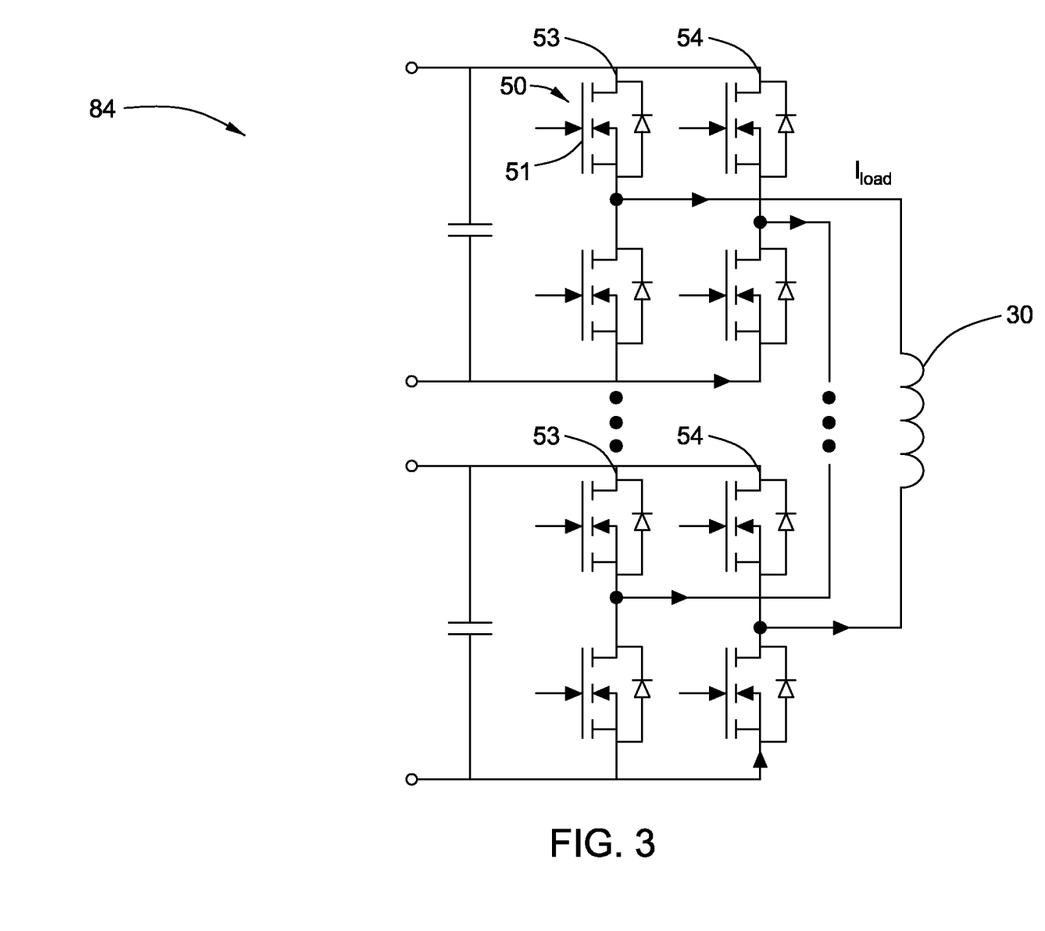
FIG. 3 is an illustrative view of a pulsed power circuit, in accordance with an embodiment of the present disclosure.

Referring to FIG. 3 of the drawings, the pulsed power circuit 84 comprises at least two H-bridges cascaded for providing pulsed current to a load, which includes the gradient coil 30 in the present embodiment. As shown in FIG. 3, each H-bridge comprises at least two legs, which include a first leg 53 and a second leg 54. Each leg comprises at least two transistor switches 50 connected in series. Each transistor switch comprises a transistor 51 and a diode 52 electrically coupled with transistor in parallel. The diode 52 is configured to conduct current to cause zero voltage potential across a source and a drain of the transistor 51. The load 30 is connected between a node between the two transistor switches 50 of first leg of the first H-bridge and a node between the two transistor switches 50 of second leg of the last H-bridge. A node between the two transistor switches 50 of second leg of the first H-bridge is connected to a node between the two transistor switches 50 of first leg of the next H-bridge, and so on, until a node between the two transistor switches 50 of second leg of the last but one H-bridge is connected to a node between the two transistor switches 50 of first leg of the last H-bridge.

The transistor of transistor switches may be SiC devices or Si devices, such as SiC metal-oxide-semiconductor field-effect transistor (MOSFET) or Si MOSFET. In some cases, some or all of the transistor switches 50 may be insulated-gate bipolar transistors (IGBTs) rather than MOSFETs. Accordingly, while the switches 50 are presently discussed as being SiC MOSFETS, it should be appreciated that their associated descriptions are intended to compass all variations in material or configuration including, but not limited to, MOSFETS and IGBTs. In one embodiment, SiC MOSFETS may be desirable to enable faster switching and a reduction in switching loss compared to other MOSFET materials, including Si.

Figure 4:
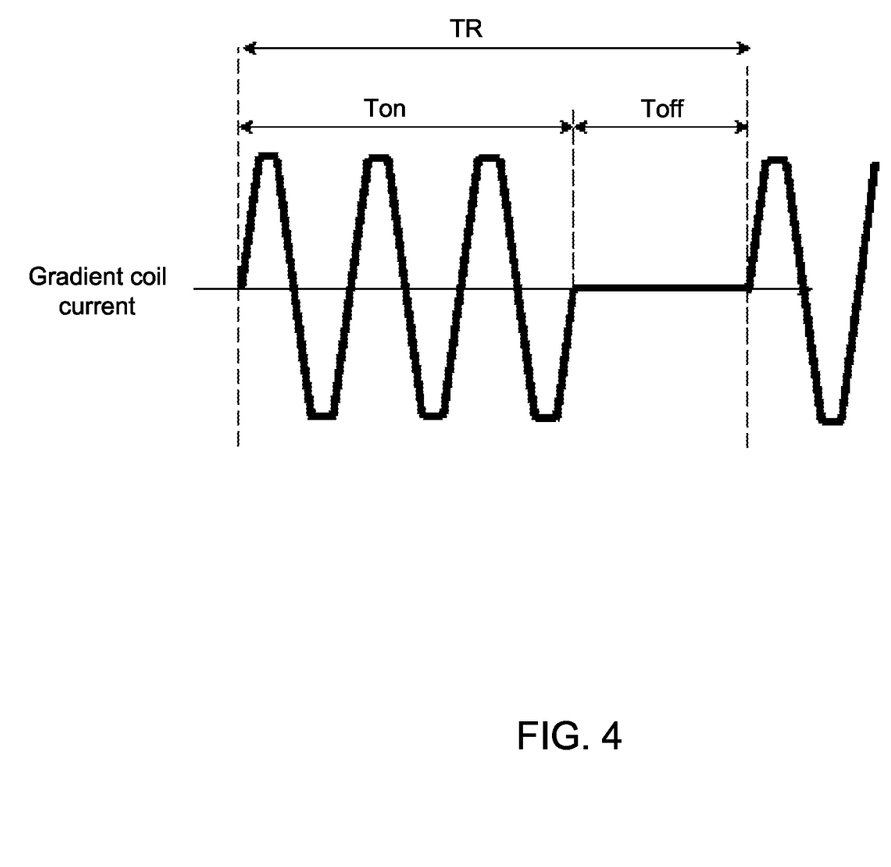
FIG. 4 is an illustrative view of a load current of the gradient coil, in accordance with an embodiment of the present disclosure.

The load current ($I_{load}$) is shown in FIG. 4. During the Ton, the gradient coil current is controlled in a certain pattern (trapezoidal, triangle, sinusoidal, etc). During the Toff, the current amplitude and the current slew rate are very small. The current can be in the range of few amperes. The current pattern is repeated in the period of TR.

The controller is connected to the SiC MOSFETs, and is configured to determine if a slew rate of the load current is lower than a threshold, and configured to reduce the switching loss, when the slew rate is lower than the threshold. The slew rate is di/dt of the load current.

In one embodiment, the controller is configured to use a first switching frequency when the slew rate is not lower than a threshold, and use a second switching frequency, which is lower than the first frequency, when the slew rate is lower than the threshold. Because the current slew rate is low, we can reduce the bandwidth without sacrificing the current control error. When the slew rate is not lower than a threshold, the controller 86 controls the pulsed power circuit 84 working normally at first switching frequency. The controller comprises a control board that generate control signals to the gate driver of the transistor switches for changing switching frequency of the transistor switches.

The controller is also configured to receive a load current signal and a reference current signal, generate a voltage command signal based on the load current signal and reference current signal, and determine a slew rate and a current amplitude of the load current associated with the reference current signal.

Figure 5:
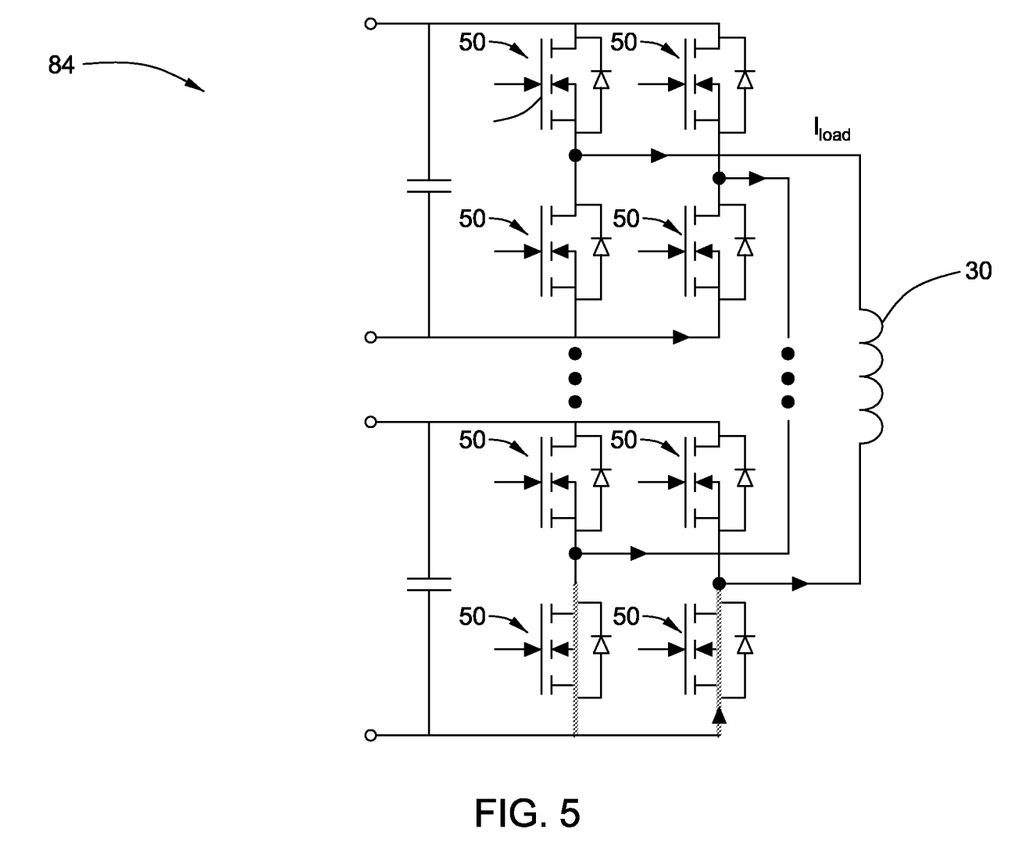
FIG. 5 is an illustrative view of a pulsed power circuit, in accordance with another embodiment of the present disclosure.

In another embodiment, referring to FIG. 5 of the drawings, the controller is configured to determine if a slew rate of the load current is lower than a threshold and a current amplitude of the load current is lower than a predetermined level, and to keep at least one H-bridge in conducting and not switching, and keep rest of the H-bridges in switching, when the slew rate is lower than the threshold and the current amplitude is lower than the predetermined level. When the slew rate is not lower than the threshold or the current amplitude of the load current is not lower than the predetermined level, the controller 86 controls the pulsed power circuit 84 to work normally. The controller comprises a control board that generate control signals to the gate driver of the transistor switches for controlling the on or off of H-bridges.

The controller is also configured to receive a load current signal and a reference current signal, generate a voltage command signal based on the load current signal and reference current signal, and determine a slew rate and a current amplitude of the load current associated with the reference current signal.

In another embodiment, as shown in FIG. 3 of the drawings, the controller is configured to determine if a slew rate is lower than a threshold and a current amplitude of the load current is lower than a predetermined level, and to raise the load current ($I_{load}$) to higher than the predetermined level, when the slew rate is lower than the threshold and the current amplitude is lower than the predetermined level, and thus the charge of the depletion capacitance will be discharged to the load not to the channel. When the slew rate is not lower than the threshold or the current amplitude of the load current is not lower than the predetermined level, the controller 86 controls the pulsed power circuit 84 to work normally. The controller comprises a control board which generates control signals to the gate driver of the transistor switches for controlling the load current.

The controller is also configured to receive a load current signal and a reference current signal, generate a voltage command signal based on the load current signal and reference current signal, and determine a slew rate and a current amplitude of the load current associated with the reference current signal.

Figure 6:
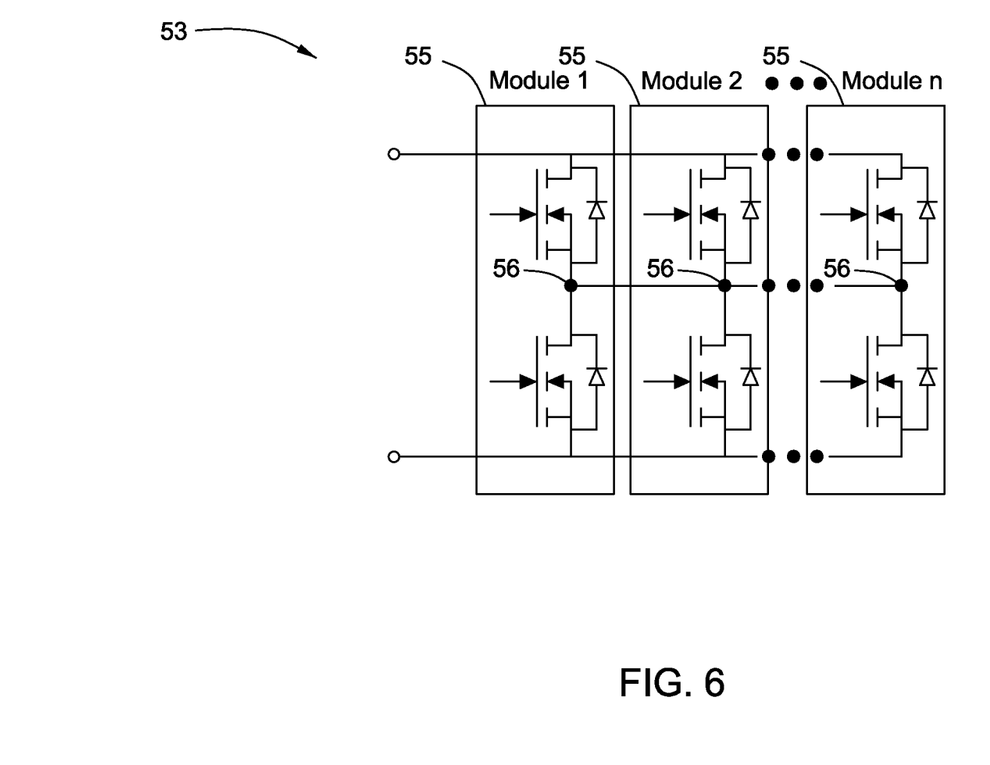
FIG. 6 is an illustrative view of a module of a pulsed power circuit, in accordance with another embodiment of the present disclosure.

In another embodiment, as shown in FIGS. 3 and 6 of the drawings, each leg of FIG. 3 comprises a plurality of modules 55 connected in parallel, each module comprises two SiC MOSFET switches connected in series, and nodes 56 between two SiC MOSFET switches of each module are electrically connected. The controller is configured to determine if a slew rate is lower than a threshold and a current amplitude of the load current is lower than a predetermined level, and to keep at least one module off (not switching), and rest of the modules switching, when the slew rate is lower than the threshold and the current amplitude is lower than the predetermined level. When the slew rate is not lower than a threshold or the current amplitude of the load current is not lower than the predetermined level, the controller 86 controls the pulsed power circuit 84 to work as normal. The controller comprises a control board that generate control signals to the gate driver of the transistor switches for controlling the modules switching or not switching. For instance, for a shared DC link of 200 A and 600V, the switching losses of two modules switching in parallel would be 60 mJ and for only one module switching it would be 46 mJ.

The controller is also configured to receive a load current signal and a reference current signal, generate a voltage command signal based on the load current signal and reference current signal, and determine a slew rate and a current amplitude of the load current associated with the reference current signal. The controller comprises a plurality of gate driver corresponding to each module respectively, so as to control the switching state of each module independently.

Figure 7:
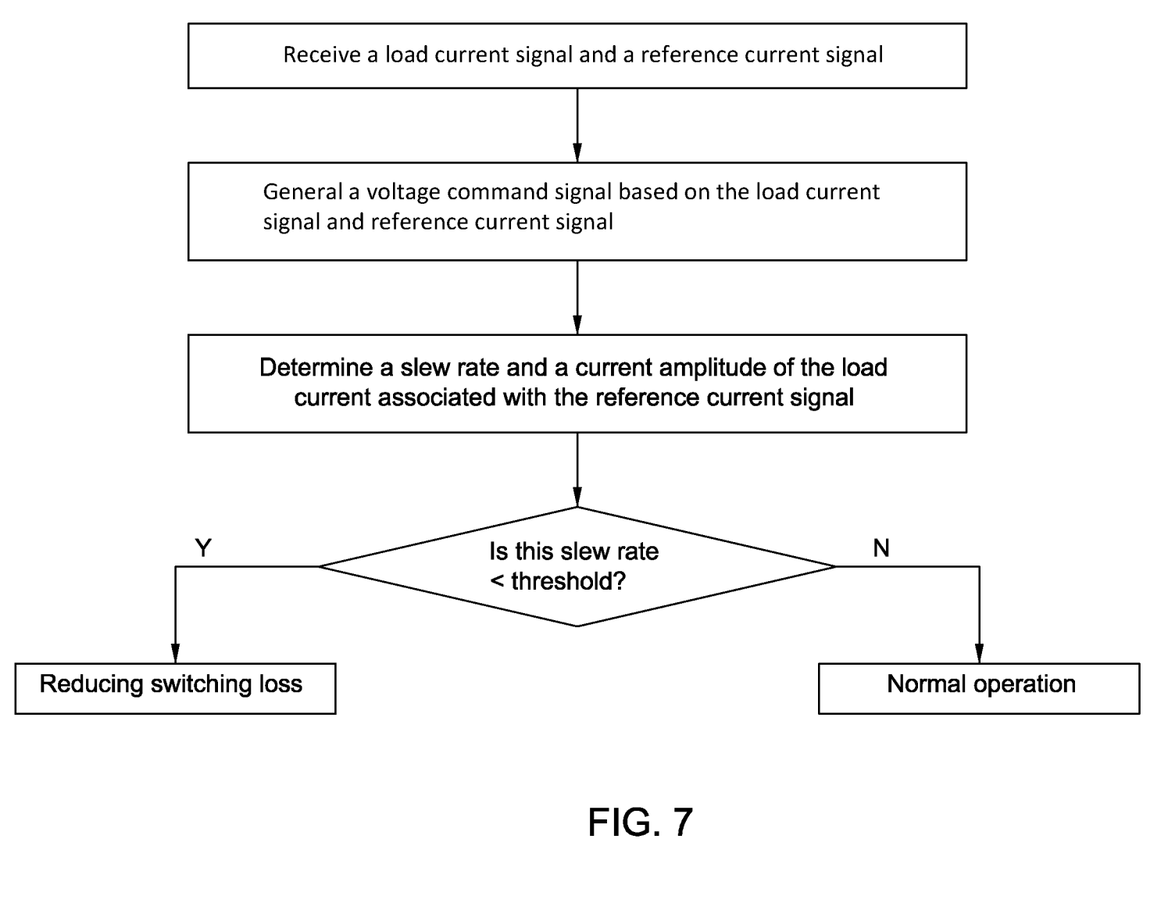
FIG. 7 is a flow chart of a controlling method of a pulsed power system, in accordance with an embodiment of the present disclosure.
Figure 8:
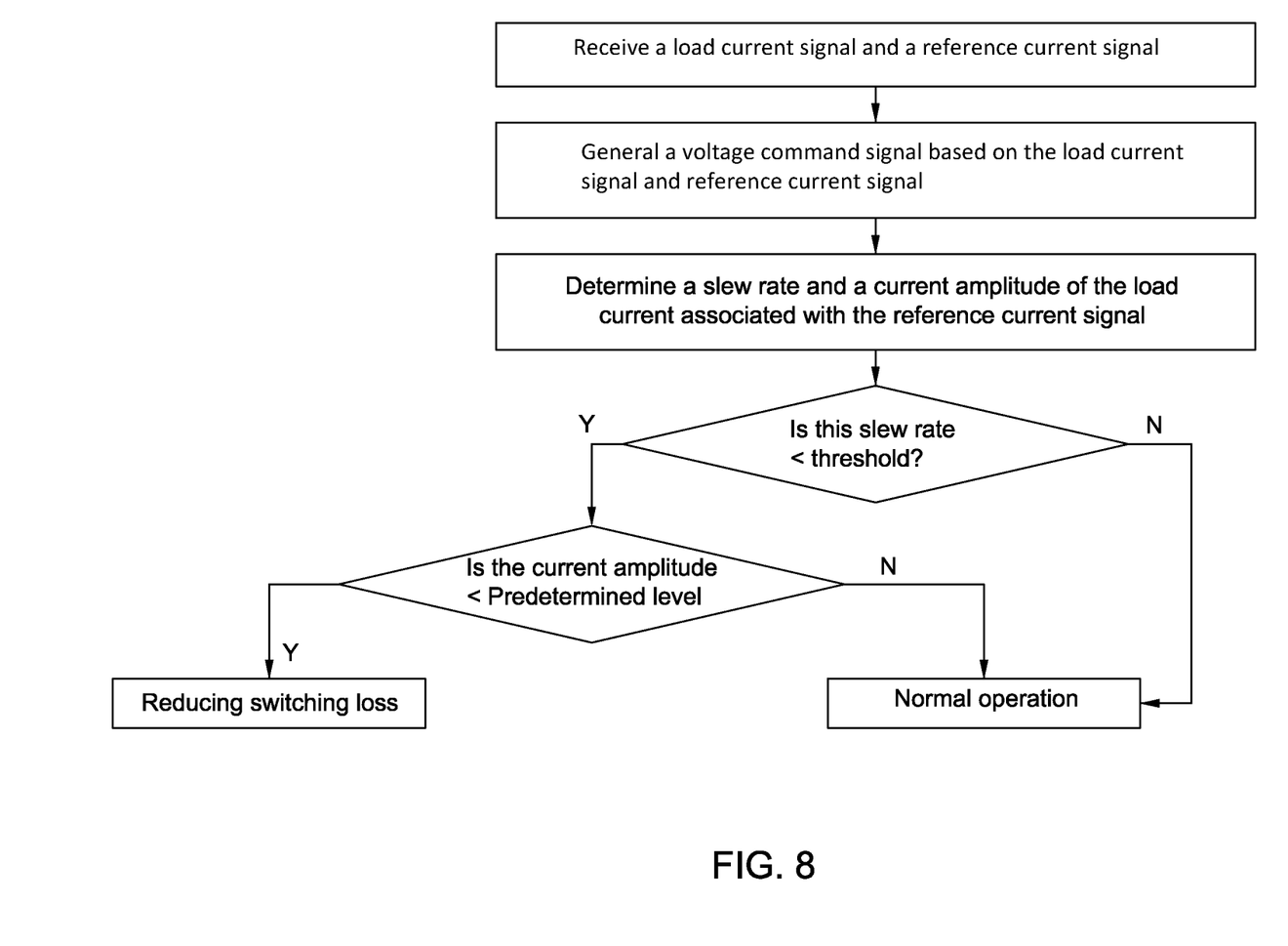
FIG. 8 is a flow chart of a controlling method of a pulsed power system, in accordance with another embodiment of the present disclosure.

Referring to FIG. 7 of the drawings, the present disclosure provides a pulsed power system controlling method for gradient coils in a magnetic resonance imaging (MRI) comprising steps of receiving a load current signal and a reference current signal, generating a voltage command signal based on the load current signal and reference current signal, determining a slew rate and a current amplitude of the load current associated with the reference current signal, reducing switching loss, when the slew rate is lower than a threshold. The slew rate is di/dt of the load current.

In one embodiment as shown in FIG. 3, reducing switching loss comprises steps of using a first switching frequency when the slew rate of the load current is not lower than the threshold, and using a second switching frequency which is lower than the first frequency when the slew rate is lower than a threshold.

In another embodiment as shown in FIG. 5, reducing switching loss comprises steps of making at least one H-bridge in conducting and not switching, and making rest of the H-bridges in switching, when the slew rate is lower than the threshold and the current amplitude is lower than a predetermined level.

In one embodiment as shown in FIG. 3, reducing switching loss comprises steps of raising the amplitude of the load current ($I_{load}$) to higher than a predetermined level, when the slew rate is lower than the threshold and the current amplitude is lower than the predetermined level.

In one embodiment as shown in FIG. 6, reducing switching loss comprises steps of keeping at least one module off (not switching), and making rest of the modules switching, when the slew rate is lower than the threshold and the current amplitude is lower than a predetermined level, wherein each H-bridges comprises at least two legs, each leg comprises a plurality of modules connected in parallel, each module comprises two SiC MOSFET switches connected in series, and nodes 56 between two SiC MOSFET switches of each module are electrically connected.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

What is claimed is:

1. A pulsed power system, comprising:
   at least two H-bridges cascaded for providing pulsed current to a load, wherein each H-bridge comprises at least two legs, and each leg comprises at least two transistor switches connected in series, wherein each transistor switch comprises a transistor and a diode electrically coupled with the transistor in parallel, and the diode is configured to conduct current across a source and a drain of the transistor, and the load is connected between a node between the two transistor switches of a first leg of a first H-bridge of the at least two H-bridges and a node between the two transistor switches of a second leg of a second H-bridge of the at least two H-bridges; and
   a controller configured to:
      determine if a slew rate of a load current across the load is lower than a threshold; and
      reduce switching loss in response to the slew rate being lower than the threshold.

2. The pulsed power system of claim 1, wherein the controller is configured to use a first switching frequency in response to the slew rate being not lower than a threshold, and use a second switching frequency, which is lower than the first frequency, in response to the slew rate being lower than a threshold.

3. The pulsed power system of claim 1, wherein the controller is further configured to:
   determine if a current amplitude of the load current is lower than a predetermined level; and
   make at least one H-bridge in conducting, and make rest of the H-bridges in switching in response to the slew rate being lower than the threshold and the current amplitude being lower than the predetermined level.

4. The pulsed power system of claim 1, wherein the controller is further configured to:
   determine if a current amplitude of the load current is lower than a predetermined level; and
   raise the current amplitude of the load current to higher than a predetermined value in response to the slew rate being lower than the threshold and the current amplitude being lower than the predetermined level.

5. The pulsed power system of claim 1, wherein each leg comprises a plurality of modules connected in parallel, each module comprises two transistor switches connected in series, the diode is configured to conduct current across a source and a drain of the transistor, and nodes between two transistor switches of each module are electrically connected, wherein the controller is further configured to:
   determine if a current amplitude of the load current is lower than a predetermined level; and
   keep at least one module off, and make rest of the modules switching, in response to the slew rate being lower than the threshold and the current amplitude being lower than the predetermined level.

6. A controlling method of a pulsed power system comprising at least two H-bridges cascaded for providing pulsed current to a load, comprising:
   receiving a load current signal and a reference current signal;
   generating a voltage command signal based on the load current signal and reference current signal;
   determining a slew rate and a current amplitude of the load current associated with the reference current signal; and
   reducing switching loss in response to the slew rate being lower than a threshold;
   wherein each H-bridges comprises at least two legs, each leg comprises a plurality of modules connected in parallel, each module comprises two transistor switches connected in series, the diode is configured to conduct current to cause zero voltage potential across a source and a drain of the transistor, and nodes between two transistor switches of each module are electrically connected, wherein reducing the switching loss comprises keeping at least one module off, and making rest of the modules switching, in response to the slew rate being lower than the threshold and the current amplitude being lower than a predetermined level.

7. The method of claim 6, wherein reducing the switching loss comprises using a first switching frequency in response to the slew rate being not lower than the threshold, and using a second switching frequency, which is lower than the first frequency, in response to the slew rate being lower than a threshold.

8. The method of claim 6, wherein reducing the switching loss comprises making at least one H-bridge in conducting, and making rest of the H-bridges in switching, in response to the slew rate being lower than the threshold and the current amplitude being lower than a predetermined level.

9. The method of claim 6, wherein reducing the switching loss comprises raising the current amplitude of the load current to higher than a predetermined level, in response to the slew rate being lower than the threshold and the current amplitude being lower than the predetermined level.

10. A MRI system, comprising:
    a primary field magnet;
    a plurality of gradient coils;
    a RF transmit coil; and
    a pulsed power system comprising:
       at least two H-bridges cascaded for providing pulsed current to a load of the gradient coils, wherein each H-bridge comprises at least two legs, and each leg comprises at least two transistor switches connected in series, wherein each transistor switch comprises a transistor and a diode electrically coupled with the transistor in parallel, and the gradient coils are connected between a node between the two transistor switches of a first leg of a first H-bridge of the at least two H-bridges and a node between the two transistor switches of a second leg of a second H-bridge of the at least two H-bridges; and a controller configured to:
determine if a slew rate of the load current across the load of the gradient coil is lower than a threshold, and
reduce switching loss in response to the slew rate being lower than the threshold.

11. The MRI system of claim 10, wherein the controller is configured to use a first switching frequency in response to the slew rate being not lower than the threshold, and using a second switching frequency, which is lower than the first frequency, when the slew rate is lower than the threshold.

12. The MRI system of claim 10, wherein the controller is further configured to:
determine if a current amplitude of the load current is lower than a predetermined level; and
make at least one H-bridge in conducting, and make rest of the H-bridges in switching in response to the slew rate being lower than the threshold and the current amplitude being lower than the predetermined level.

13. The MRI system of claim 10, wherein the controller is further configured to:
determine if a current amplitude of the load current is lower than a predetermined level; and
raise the current amplitude of the load current to higher than a predetermined value in response to the slew rate being lower than the threshold and the current amplitude being lower than the predetermined level.

14. The MRI system of claim 10, wherein each leg comprises a plurality of modules connected in parallel, each module comprises two transistor switches connected in series, the diode is configured to conduct current across a source and a drain of the transistor, and nodes between two transistor switches of each module are electrically connected, wherein the controller is further configured to:
determine if a current amplitude of the load current is lower than a predetermined level; and
keep at least one module off, and make rest of the modules switching, in response to the slew rate being lower than the threshold and the current amplitude being lower than the predetermined level.

* * * * *